(12) United States Patent
Catey et al.

(10) Patent No.: US 6,239,863 B1
(45) Date of Patent: May 29, 2001

(54) REMOVABLE COVER FOR PROTECTING A RETICLE, SYSTEM INCLUDING AND METHOD OF USING THE SAME

(75) Inventors: Eric B. Catey; David Hult, both of Danbury, CT (US); Santiago del Puerto, Milton; Stephen Roux, Purdys, both of NY (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

(21) Appl. No.: 09/473,710

(22) Filed: Dec. 29, 1999

(51) Int. Cl.$^7$ .................. G03B 27/62; G03B 27/32; G03B 1/48
(52) U.S. Cl. ................. 355/75; 355/23; 355/25; 355/47; 355/75; 353/23; 353/95
(58) Field of Search ................. 355/23, 25, 47, 355/75; 353/23, 95

(56) References Cited

U.S. PATENT DOCUMENTS

| | | | |
|---|---|---|---|
| 4,250,388 | * 2/1981 | Janu ........................... 250/468 |
| 4,369,475 | * 1/1983 | Ho et al. .................... 360/97 |
| 4,412,739 | * 11/1983 | Freiberg ...................... 355/89 |
| 4,443,098 | * 4/1984 | Walwyn et al. ............. 355/74 |
| 4,549,843 | * 10/1985 | Jagusch et al. ............ 414/416 |
| 4,634,270 | * 1/1987 | Yokoo et al. ............... 355/125 |
| 4,657,805 | * 4/1987 | Fukumitsu et al. ......... 428/215 |
| 4,719,705 | 1/1988 | Laganza et al. ............ 33/568 |
| 4,760,429 | 7/1988 | O'Connor .................... 355/77 |
| 4,770,590 | 9/1988 | Hugues et al. .............. 414/172 |
| 4,778,332 | 10/1988 | Byers et al. ................. 414/735 |
| 4,973,217 | 11/1990 | Engelbrecht ................ 414/754 |
| 4,986,007 | 1/1991 | Laganza et al. ............ 33/621 |
| 5,422,704 | * 6/1995 | Sego .............................. 355/53 |
| 5,453,816 | * 9/1995 | Wang ............................ 355/75 |
| 5,492,587 | * 2/1996 | Hong ............................ 156/246 |
| 5,643,654 | * 7/1997 | Fugita et al. ................. 428/138 |
| 5,700,046 | 12/1997 | Van Doren et al. ........ 294/119.1 |
| 5,727,685 | 3/1998 | Laganza et al. ............ 206/455 |
| 5,733,024 | 3/1998 | Slocum et al. ............. 312/223.2 |
| 5,928,817 | * 7/1999 | Yan et al. ..................... 430/5 |
| 6,055,040 | * 4/2000 | Sego ............................. 355/76 |

OTHER PUBLICATIONS

Yoshitake et al., "New Mask Blank Handling System for the Advanced Electron Beam Writer," SPIE vol. 3873, pp. 905–915, Sep. 1999.

* cited by examiner

Primary Examiner—Russell Adams
Assistant Examiner—Khaled Brown
(74) Attorney, Agent, or Firm—Sterne, Kessler, Goldstein & Fox, P.L.L.C.

(57) ABSTRACT

A removable cover for protecting a reticle used in a lithography system is described. The removable cover includes a frame and a membrane supported by the frame. The membrane is transparent to an inspection wavelength such that the reticle can be inspected with the removable cover in place. This removable cover protects the reticle when the removable cover is in place and is removable for lithographic exposure. The removable cover can further include at least one reticle fastener that applies force to the reticle thereby preventing movement of the removable cover relative to the reticle when the removable cover is in place. A plurality of fasteners are used to position and secure the removable cover and reticle. A method of performing lithography and a lithographic system are also described.

38 Claims, 14 Drawing Sheets

REMOVABLE COVER FOR PROTECTING A RETICLE, SYSTEM INCLUDING AND METHOD OF USING THE SAME

BACKGROUND OF THE INVENTION

1. Field of the Invention

This invention generally relates to lithography, and more specifically to the protection of lithographic reticles without the use of a pellicle.

2. Related Art

Lithography is a process used to create features on the surface of substrates. Such substrates can include those used in the manufacture of flat panel displays, circuit boards, various integrated circuits, and the like. A semiconductor wafer, for example, can be used as a substrate to fabricate an integrated circuit.

During lithography, a reticle is used to transfer a desired pattern onto a substrate. The reticle is formed of a material transparent to the lithographic wavelength being used, for example glass in the case of visible light. The reticle has an image printed on it. The size of the reticle is chosen for the specific system in which it is used. A reticle six inches by six inches and one-quarter inch thick may be used, for example. During lithography, a wafer, which is disposed on a wafer stage, is exposed to an image projected onto the surface of the wafer corresponding to the image printed on the reticle.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

As should be clear from the above discussion, the accurate location and size of features produced through lithography is directly related to the precision and accuracy of the image projected onto the wafer.

The rigors of sub-100 nm lithography place stringent demands not only on the lithography tool, but also on the reticle. Air borne particles and dust that settle on the reticle can cause defects on the wafer. Small image distortions or displacements in the reticle plane can swamp critical dimension and overlay error budgets. The conventional solution is to use a thin piece of permanently fixed transparent material as a pellicle for the reticle. This pellicle remains in place during all stages of the lithography process. A pellicle has a dual role in improving the accuracy of the image projected onto a wafer. First, a pellicle serves to protect the reticle from direct contact with particulate contamination. Particles that settle on the reticle can produce image distortion and so must be removed. Removal of particles from the reticle can cause damage to the reticle because such removal may involve direct contact with the reticle. When a pellicle is used, particles will settle on the pellicle rather than the reticle. Thus, it is the pellicle which must be cleaned. Cleaning the pellicle rather than the reticle poses fewer dangers to the integrity of the reticle since the reticle is protected during this cleaning by the pellicle itself.

The second role played by a pellicle is related to the standoff of the pellicle. During exposure, the focal plane corresponds to the location of the image printed on the reticle. By including a pellicle, any particles in the system will settle on the pellicle rather than the reticle. By virtue of the thickness of the pellicle, and thus the distance between the surface of the pellicle and the patterned surface of the reticle, these particles will not be in the focal plane. Since the pellicle lifts the particles out of the focal plane, the probability that the image projected onto the substrate will include these particles is greatly reduced.

This solution discussed above works well in many conventional lithographic processing techniques. Since materials are available for producing transparent pellicles and reticles, the use of such a system is convenient in, for example, a system in which light must pass through both the reticle and the pellicle.

The pellicle approach, however, is not well suited for use in extreme-ultraviolet (EUV) applications. Currently, there are no materials sufficiently transparent to EUV that can be used to make a pellicle. In EUV lithography, the EUV does not pass through the reticle, but is reflected off the image side of the reticle. This technique is known as reflective lithography. If a pellicle were to be used in a reflective lithography process, the EUV would necessarily pass through the pellicle twice, once on the way to the reticle and again after reflecting off of the reticle. Thus, any amount of light loss associated with the pellicle is effectively doubled with EUV processing techniques.

SUMMARY OF THE INVENTION

A pellicle material has not been disclosed within the industry that is sufficiently transparent to EUV and compatible with the vacuum environment in which EUV reflective lithography takes place. Thus, the present invention is directed to a removable cover to protect a reticle during lithography processing.

The removable cover of the instant invention minimizes friction and thus reduces particle generation. The removable cover of the instant invention can be securely mounted to a reticle during most processing and transport steps and is easily removed for the exposure step. Furthermore, the removable cover of the instant invention is designed to be held by a simple end effector and transported by that end effector between a shelf and a reticle mount. The removable cover of the instant invention is compatible with the reticle mount such that the reticle can be mounted with the removable cover in place. Thus, the removable cover of the instant invention achieves much of the advantages of conventional pellicles yet is compatible with EUV lithography.

In a preferred embodiment of the instant invention, the removable cover for protecting a reticle used in a lithography system includes a frame and a membrane supported by the frame. The membrane is transparent to an inspection wavelength such that the reticle can be inspected with the removable cover in place. This removable cover protects the reticle when the removable cover is in place and is removable for lithographic exposure. Since the cover is removable, the membrane can be formed of a material that is at least partially opaque to an exposure wavelength used in the lithography process. The removable cover can further include at least one reticle fastener that applies force to the reticle thereby preventing movement of the removable cover relative to the reticle when the removable cover is in place.

The reticle fastener can be one or more rotationally actuated bi-stable fasteners that serve to bias the reticle in a direction away from the bi-stable fasteners when the bi-stable fasteners are in a fastened position.

Furthermore, the removable cover of the preferred embodiment includes a filter that allows gas flow between the removable cover and the reticle when the removable cover is in place.

The frame of the removable cover of the preferred embodiment includes a plurality of ridges. The ridges serve to contact the reticle when the removable cover is in place. When the removable cover is in place and the bi-stable fasteners are in a fastened position, the bi-stable fasteners bias the reticle toward at least two of the plurality of ridges.

The removable cover of the preferred embodiment further includes positional locators disposed on a side of the removable cover opposite from a side that faces the reticle when the removable cover is in place. These positional locators can be selected from the group consisting of bumps and detents. Furthermore, in the preferred embodiment, the positional locators are arranged to permit contact between a first set of positional locators and a shelf, and between a second set of the positional locators and an end effector while the removable cover is disposed on the shelf.

The frame of the removable cover according to a preferred embodiment of the instant invention further includes a plurality of flanges extending in a direction perpendicular to a plane corresponding to the opening in the frame such that when the removable cover is in place, the reticle is partially bounded at lateral edges by the plurality of flanges. The plurality of flanges can be integrally formed with the frame. The opening is covered by the membrane transparent to an inspection wavelength. At least one bi-stable fastener can be located within a first of the plurality of flanges. The removable cover further includes a first ridge disposed on the frame adjacent the first flange and second and third ridges disposed on the frame adjacent a second of the plurality of flanges opposite the first flange. The second and third ridges extend onto an interior side of the second flange such that when the removable cover is in place and the bi-stable fastener is in a fastened position, the reticle is biased towards the second and third ridges on the interior side of the second flange.

Also disclosed is a lithographic system that includes areticle, are movable cover that protects the reticle when the reticle is not in use, a shelf that supports the reticle and the removable cover, a mount, and an end effector that transports the reticle with the removable cover in place from the shelf to the mount.

Also disclosed is a method of performing lithography including the steps of: (a) positioning a reticle covered by a removable cover onto a mount; (b) removing the removable cover from the reticle; (c) performing lithographic exposure; and (d) replacing the removable cover on the reticle. In a preferred embodiment, the method further includes a step of transporting the reticle covered by the removable cover from a shelf to the mount prior to step (a). The preferred method further includes a step of returning the reticle covered by the removable cover to the shelf after step (d). A step of inspecting the reticle while the removable cover is in place can be performed since the membrane of the removable cover is transparent to an inspection wavelength. Furthermore, the disclosed method can include the steps of unfastening at least one bi-stable fastener on the removable cover thereby releasing the reticle from the removable cover prior to exposure and fastening the at least one bi-stable fastener on the removable cover thereby securing the reticle to the removable cover after exposure.

BRIEF DESCRIPTION OF THE FIGURES

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Lithography has traditionally relied on a pellicle to protect the patterned area of the reticle from particulate contamination. In the present situation, the absence of pellicle materials that are transparent to Extreme Ultra Violet (EUV) light precludes this approach. As an alternative, a reticle cover that is removed for exposure and for cleaning is presented.

While lithography systems operate in clean environments, particles are generated during processing. These particles may contaminate the reticle. The reticle is periodically cleaned such that the particulate level on the reticle remains below an allowable threshold. It is thus necessary to consider the sources of particle generation within a lithographic system. Typically, particles within an otherwise clean system are generated as a result of friction. In conventional systems, particles are generated when reticles are transferred from one place to another. Since in conventional systems it is possible for the reticle to slide during transport, additional particles may be generated as a result of any reticle sliding during transport. Finally, vibration in conventional systems also causes friction and associated particle generation. In the instant invention, positional locators and ridges on the removable cover are included to eliminate transfer and reticle sliding friction. However, cover attachment and removal can produce friction. Likewise, vibration, as in conventional systems, also contributes to particle formation. Thus, these differences in the causes of particle generation should be considered when implementing the instant invention.

In addition to particle generation, particle settling is also a consideration when designing a lithographic system. The use of a removable cover in the instant invention eliminates the opportunities for particles to settle onto the reticle at all times except during the exposure step. Since the instant inventors have discovered that significant particle settling occurs at times other than during exposure, the use of a removable cover provides significant protection to the reticle from particle settling even though the cover is removed during exposure steps.

Finally, particle migration must also be considered. Particle migration occurs during turbulence caused by fast motions and quick pressure changes. In the EUV systems, many of the movements occur in a high vacuum environment. Thus, turbulence during movements from, for example, the library shelf to the projection mount is minimal. However, pressure changes are involved and so this source of turbulence must be considered. An additional source of particle migration in the instant invention results from the use of the removable cover. Since particles may be released by the cover, this source of particle migration should be considered when implementing the removable cover of the instant invention.

Figure 1A:
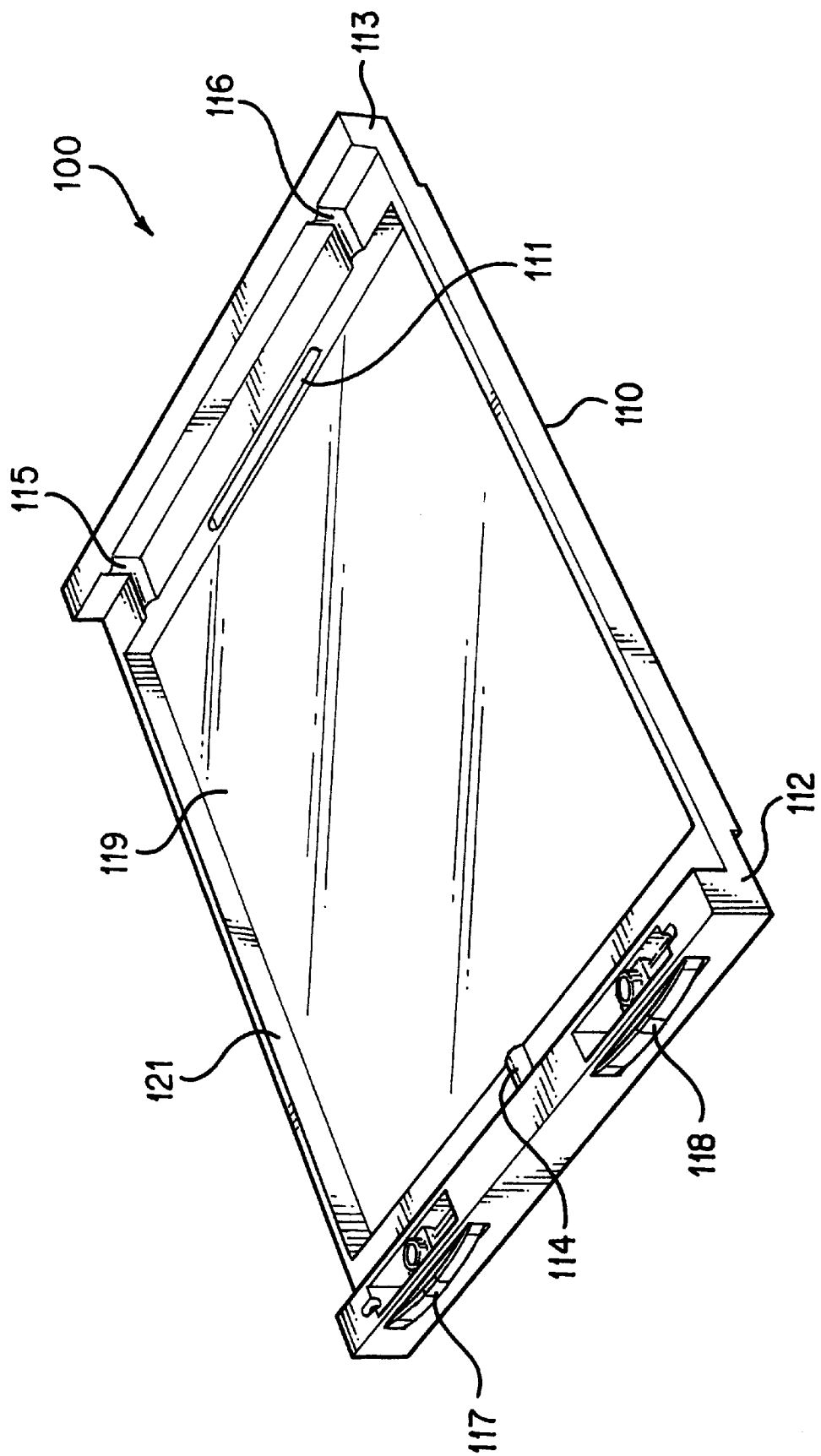
FIG. 1A is an overhead view of the removable cover of the invention.

Turning to a structure of the removable cover according to the instant invention, FIG. 1A illustrates a preferred embodiment of the removable cover 100. The removable cover includes a frame 110. Frame 110 includes an opening 121 corresponding to an inspection window. The material used for the frame should be selected with several considerations in mind. The material should be compatible with standard cleaning agents used with lithography systems. The material should not produce out gassing of amines, or other undesirable substances harmful to the lithographic process. The material should further be resistant to mechanical degradation. Since the removable cover is used in the high vacuum environment of EUV lithography, these material characteristics should hold true in that environment. Examples of possible materials that could be used includes fiber reinforced molded polymers, Derlin (trademark) or PTFE (Teflon (trademark)) coated metals such as aluminum or titanium. Other materials may be used without departing from this invention. Such materials could be selected by one skilled in the art given this disclosure.

Frame 110 further includes a filter 111. This filter allows gas flow through the frame 110 while preventing passage of particles to the reticle. Accordingly, the cover is able to breathe during pump and vent cycles.

Figure 1B:
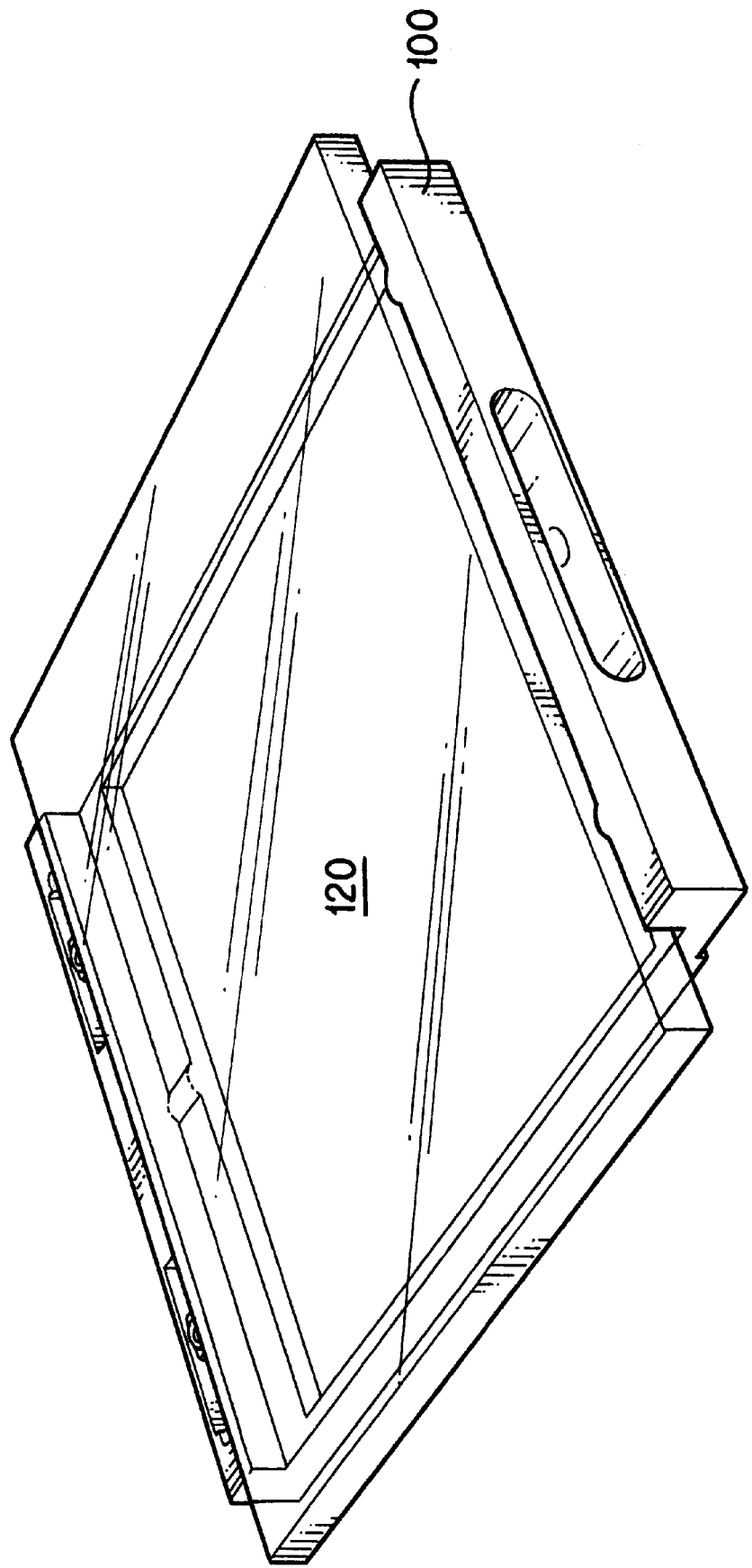
FIG. 1B is an overhead view of the removable cover of the invention in position on a reticle.

Frame 110 further includes flanges 112 and 113. These flanges can be formed integrally with the frame, as is illustrated. As shown in the figure, flanges 112 and 113 extend in a direction perpendicular to the window defined by the frame. These flanges serve to partially surround lateral edges of a reticle when the removable cover is in place on a reticle. This relationship is shown in FIG. 1B, for example, and will be discussed below in more detail.

Frame 110 further includes ridges 114, 115, and 116. As can be seen in FIG. 1, a first ridge 114 is formed on the frame adjacent the first flange 112. This first ridge 114 is used as a first resting point for a reticle when the removable cover is in place on the reticle. Second and third ridges 115, 116 are formed on the frame adjacent the second flange 113. The second and third ridges are used as second and third resting points for a reticle when the removable cover is in place on the reticle. While one skilled in the art, given this disclosure, would understand that more or fewer ridges could be provided without departing from the invention, the preferred embodiment includes three ridges as this number is ideal for stabilizing a reticle on the removable cover. Furthermore, while the ridges 114, 115, and 116 are provided to minimize contact between the removable cover and reticle, thereby minimizing particle generation friction, a removable cover without ridges would be within the scope of the instant invention, as would be apparent to a person skilled in the relevant art given this disclosure. Finally, while the ridges 114, 115, and 116 produce a gap between the frame 110 and a reticle, the height of the ridges can be made small enough so that gas conductance through the filter 111 is higher than through the gap created by ridges 114, 115, and 116.

As can further be seen in FIG. 1A, second and third ridges 115, 116 extend up the interior side of second flange 113. These second and third ridges work in conjunction with first and second fasteners 117, 118 to secure the removable cover to the reticle, as discussed more fully below.

Figure 2:
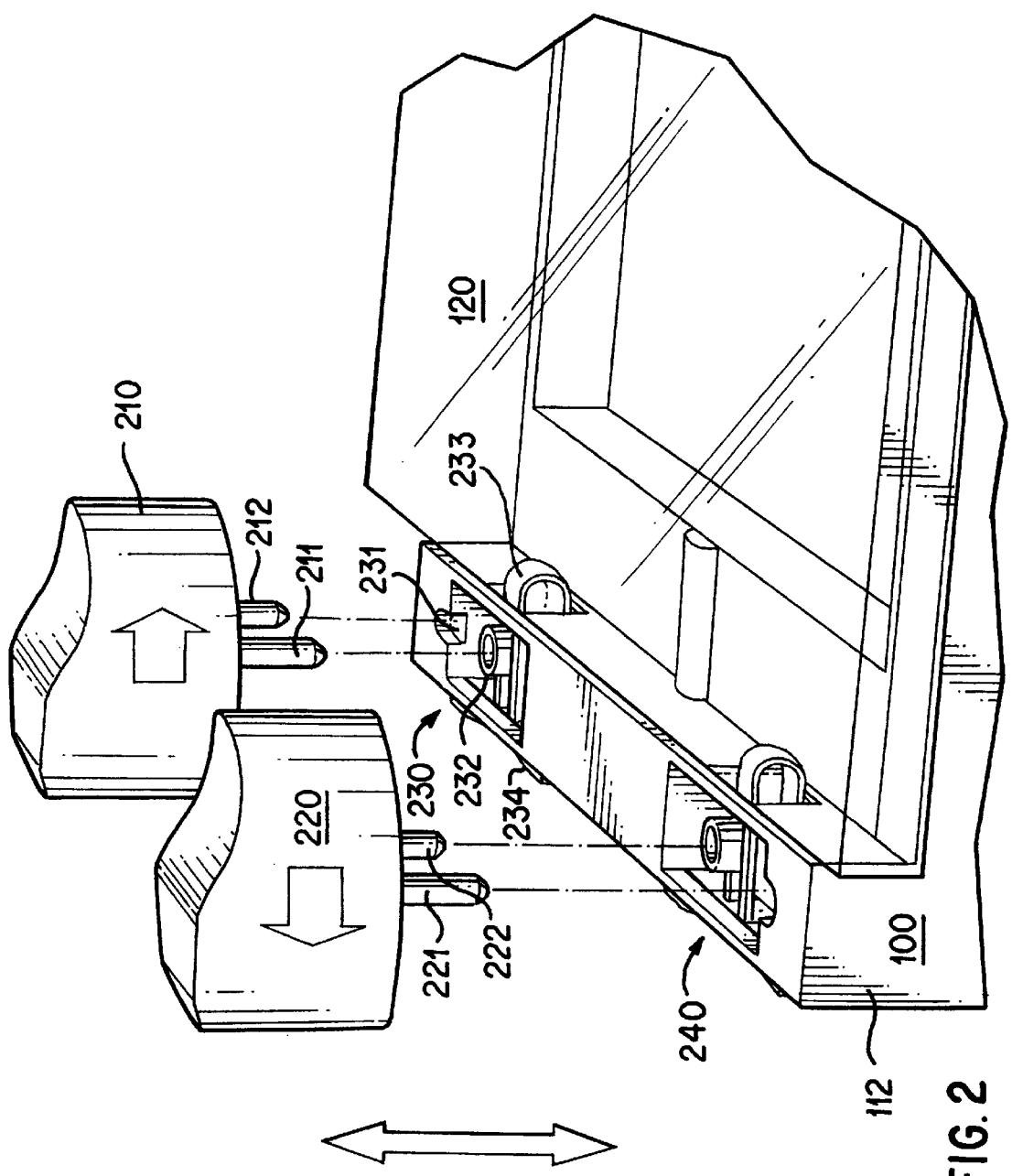
FIG. 2 illustrates details of bi-stable fasteners and associated drivers according to the invention.

The frame 110 further includes first and second fasteners 117, 118 located in the first flange 112. These first and second fasteners are preferably bi-stable fasteners. As used herein, the phrase "bi-stable" is meant to define a fastener that has two stable conditions: fastened and unfastened. The fastener will remain in either position without additional control or force applied to the fastener. Such fasteners, for example, may be formed as rotationally actuated fasteners that each include a bi-stable spring serving to hold the fasteners in either a fastened or unfastened position. Such an arrangement is shown, for example, in FIG. 2, discussed more fully below. Fasteners 117, 118, when fastened, bias the reticle towards second and third ridges 115, 116. Thus, in the preferred embodiment, when the removable cover is in place on the reticle, the reticle is in contact with the removable cover at seven points: first, second, and third ridges 114, 115, 116 on the surface of the removable cover facing the reticle; second and third ridges 115, 116 extending on the interior side of the second flange 113, and at the first and second fasteners 117, 118. This is illustrated in FIG. 1B, which shows a removable cover 100 in place on a reticle 120 having a patterned side facing the removable cover. In this manner, the reticle is firmly secured to the removable cover thereby eliminating movement of the reticle relative to the cover. At the same time, contact between the reticle and the cover is minimized. Since the reticle 120 is used in reflective lithography systems, any particles that settle on the side of the reticle away from the cover will not contribute to degradation of the reflected image. While one skilled in the art, given this disclosure, would understand that the fasteners, or ridges, or both, could be omitted without departing from the instant invention, these elements are included in the preferred embodiment to minimize particle generation.

As discussed above, FIG. 2 illustrates details of an example of bi-stable fasteners 230, 240 used in the instant invention. Bi-stable fastener 230 is provided in a first flange 112 and includes a first engagement point 232 for a corresponding first pin 211 on a fastener driver 210. Flange 112 includes a second engagement point 231 for a corresponding second pin 212 on the fastener driver 210. Bi-stable fastener 230 also includes fastening point 233 and bi-stable spring 234. During operation, fastener driver 210 rotates while pins 211 and 212 are engaged with engagement points 232 and 231, respectively. This rotation moves engagement point 232 relative to engagement point 231. Moving engagement point 232 in the direction towards the interior of the cover moves bi-stable spring 234 to its fastened position, thus causing fastening point 233 to apply constant pressure to the reticle. This pressure is maintained while the fastener is in a fastened position, thus biasing the reticle against a ridge located on the opposite side of the frame (not shown in FIG. 2). Unfastening is performed simply by rotating the fastener driver in the opposite direction while pins 211 and 212 are engaged with engagement points 232 and 231. Bi-stable fastener 240 works in the same manner as does fastener 230. An additional driver 220 can be provided to control fastener 240. While a particular type of fastener has been described, different types of fasteners could be used without departing from the scope of the invention, given this disclosure. Likewise, the number fasteners used and their placement could be altered from the illustrated example without departing from the invention, given this disclosure. For example, a single electro-magnetically actuated fastener could be used.

Returning to FIG. 1A, removable cover 100 further includes a membrane 119, which covers the opening 121 within the frame 110. This membrane corresponds to an inspection window. In a preferred embodiment, membrane 119 is transparent to an inspection wavelength. The term "inspection wavelength" is meant to include a wavelength of light used for inspection and identification of the reticle. In EUV applications, this wavelength will differ from the wavelength used during exposure. Membrane 119 is thus formed of a material transparent to an inspection wavelength. Accordingly, the reticle can be inspected and identified while the removable cover is in place. Preferably, the material used for the membrane is compatible with a vacuum environment and is resistant to transparency degradation at the inspection wavelength. Likewise, the material should be compatible with standard cleaning agents used with lithographic systems. Thus, as one skilled in the art would recognize given this disclosure, the membrane material can be the type of material used to fabricate conventional pellicles. For example, polymer sheets with similar properties to pellicles, or even glass, could be used. The selection of the particular material used for the membrane would be apparent to a person skilled in the relevant art given this disclosure.

Figure 3A:
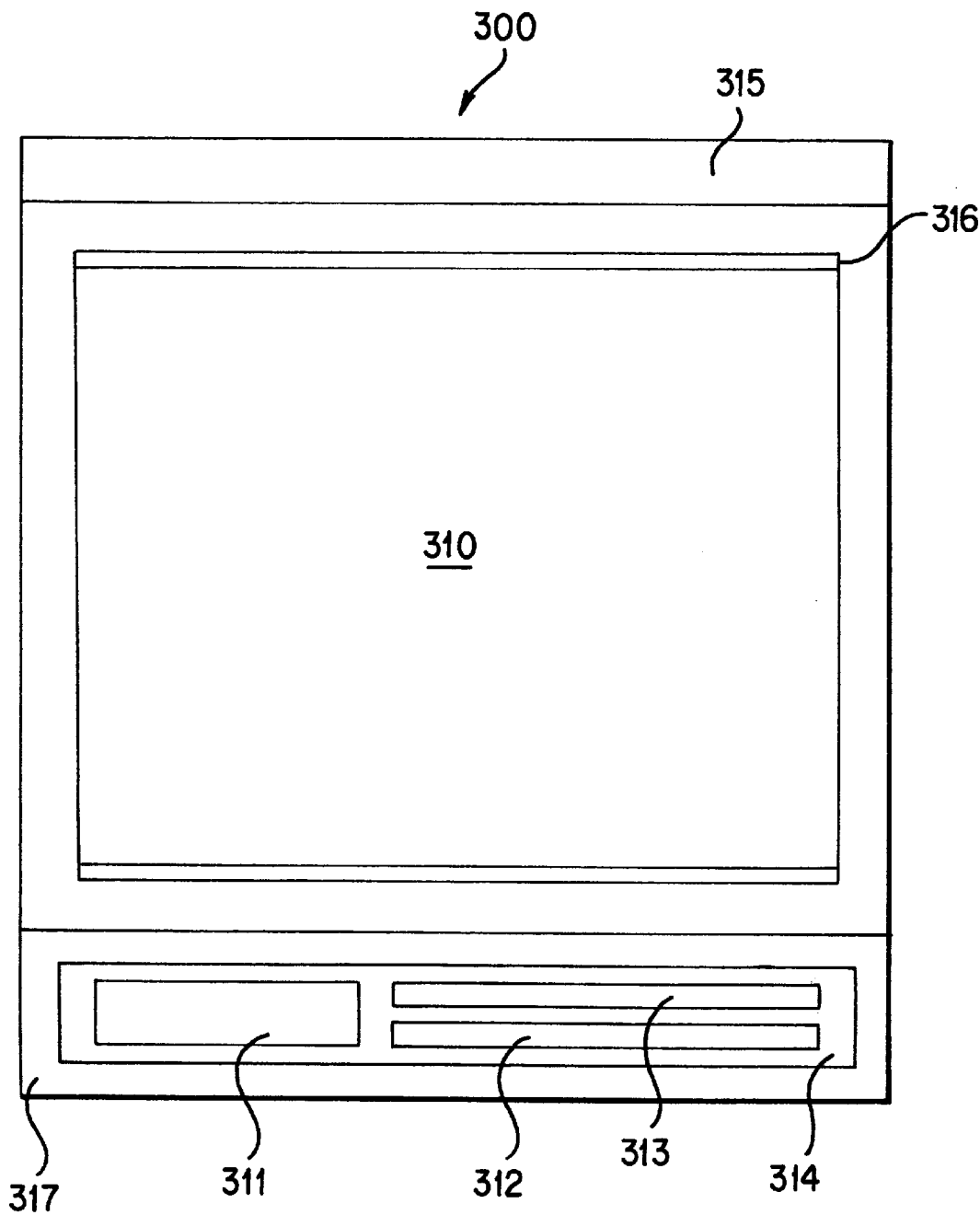
FIGS. 3A and 3B are diagrams of a reticle used with the removable cover of the invention.
Figure 3B:
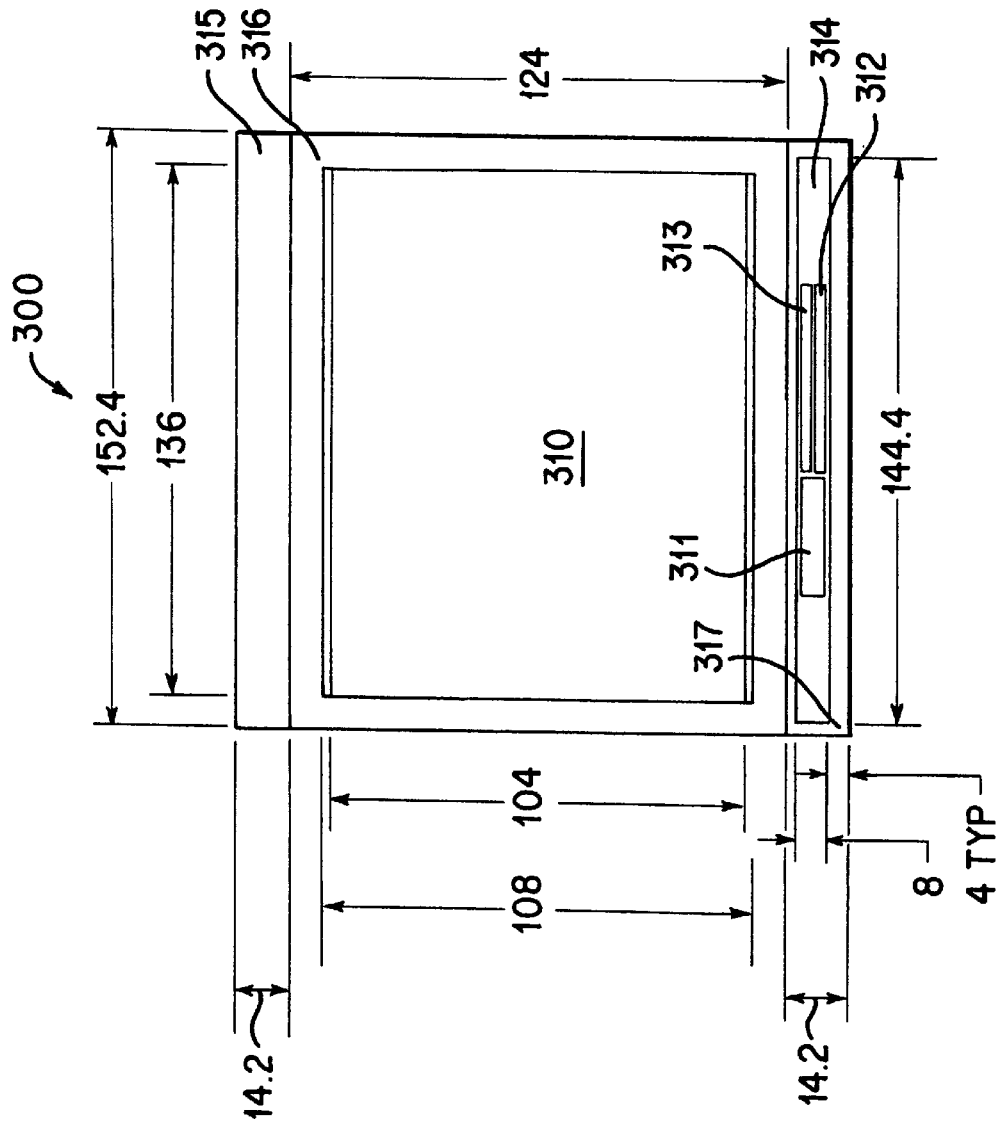

The size of the inspection window can be chosen to allow for inspection and identification of desired regions of the reticle. FIG. 3A is a diagram of a reticle 300 that may be used in connection with the removable cover of the instant invention. Reticle 300 includes printable area 310. Region 311 includes a machine readable ID. Region 312 includes the title of the reticle. Region 313 includes an alpha-numeric ID. Regions 311, 312, and 313 are all within region 314, which is the ID placement area in this exemplary reticle. Region 315 is available for mounting reference and coarse alignment targets. Region 316 is reserved for lithography use, and region 317 is a mounting reference area. FIG. 3B is a diagram of the reticle of FIG. 3A with dimensions added. The dimensions of FIG. 3B are in millimeters. The reticle described and illustrated in FIGS. 3A and 3B is an example of a reticle that can be used in the instant invention. Other reticles can be used as would be apparent to a person skilled in the relevant art without departing from the spirit of this invention given this disclosure.

In the preferred embodiment, the dimensions of the reticle and removable cover are selected such that the reticle extends beyond two opposite sides of the removable cover. This arrangement provides for simple loading of the reticle onto a reticle mount with the removable cover in place, as will be discussed later.

Figure 4:
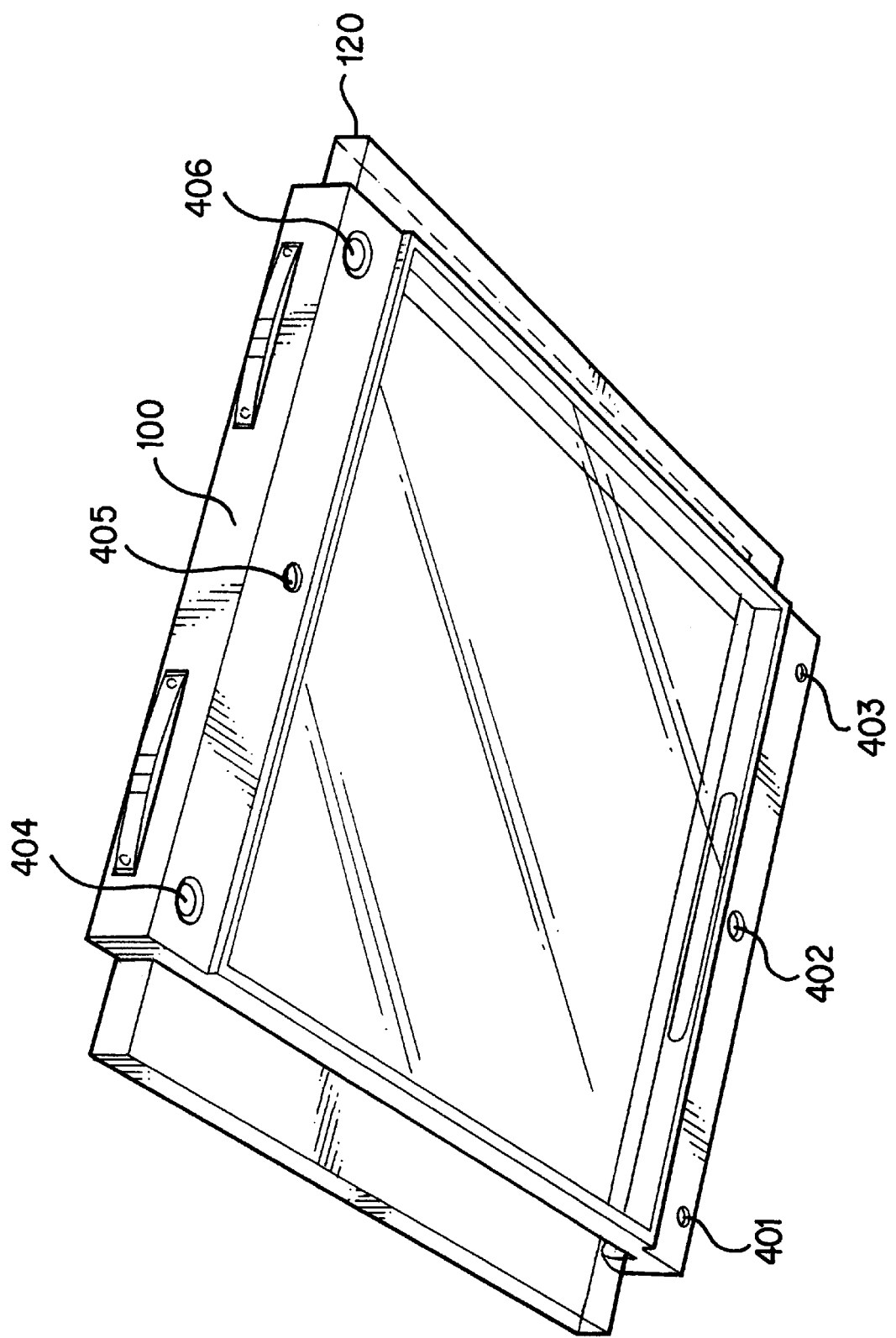
FIG. 4 is a bottom view of the removable cover of the invention in position on a reticle.

FIG. 4 is a bottom view of the removable cover 100 of the preferred embodiment in place on a reticle 120. As can be seen in the figure, removable cover 100 includes positional locators 401–406 on a side of the removable cover 100 opposite from a side that faces the reticle 120 when the removable cover is in place. These positional locators are used together with other positional locators located on an end effector and on a shelf, as discussed below. While the positional locators have been illustrated as detents or bumps, other types of positional locators could be used without departing from the invention, as would be apparent to a person skilled in the relevant art given this disclosure.

In the preferred embodiment, positional locators 401, 403, and 405 constitute to a first set of positional locators used in conjunction with a shelf while positional locators 402, 404, and 406 correspond to a second set of positional locators used in conjunction with an end effector. These two sets of positional locators have been illustrated as having slightly different sizes for exemplary purposes, though all positional locators could be of the same size without departing from the spirit of the invention, as one skilled in the art would recognize given this disclosure. Likewise, the particular number and arrangement of positional locators has been illustrated in conjunction with the preferred embodiment. As such, the number and positions of the positional locators could be changed without departing from the instant invention, as would be apparent to a person skilled in the relevant art given this disclosure.

Figure 5:
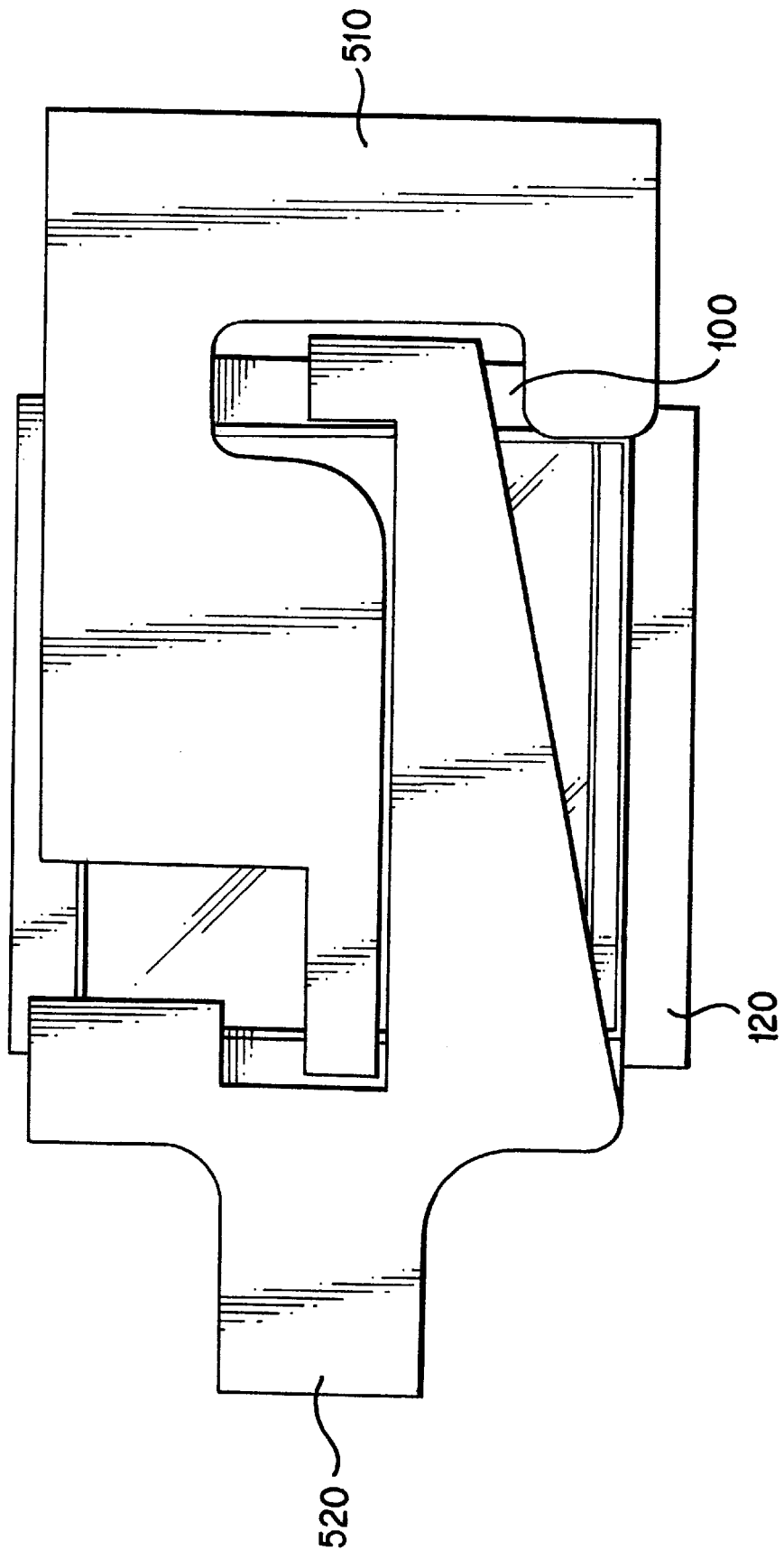
FIG. 5 is a bottom view of the removable cover of the invention in position on a reticle and supported by a shelf, an end effector is also shown.

FIG. 5 is a bottom view illustrating a removable cover 100 and reticle 120 disposed on a shelf 510. The shelf 510 includes positional locators (not visible) that are engaged with the first set of positional locators 401, 403, 405 on the removable cover 100, discussed above in connection with FIG. 4. Also shown is an end effector 520. The end effector 520 also includes positional locators (not visible) that are engaged with the second set of positional locators 402, 404, 406 on the removable cover 100, discussed above in connection with FIG. 4. The shelf 510 is one of many shelves within a library (not shown), each of which includes a removable cover and reticle. The library of shelves is within a lithography tool (not shown). The end effector 520 is connected to a robot (not shown) and is used to transport the removable covers and reticles to and from the shelves. Since in the preferred embodiment the removable cover 100 includes two sets of three positional locators 401–406, the removable cover 100 with reticle 120 is stable when it is supported at either set of positional locators. The end effector 520 and shelf 510 are shaped such that the removable cover 100 and reticle 120 can rest on the shelf 510 while the end effector 520 can access positional locators not covered by the shelf. Thus, the end effector 520 can move in under the shelf 510 and lift the removable cover 100 and reticle 120 up off the shelf 510 while the removable cover 100 with reticle 120 remains supported at three points through the entire process. In this manner, the use of moving parts with their associated friction is minimized within the structure, thus reducing the likelihood of particle generation.

Figure 6:
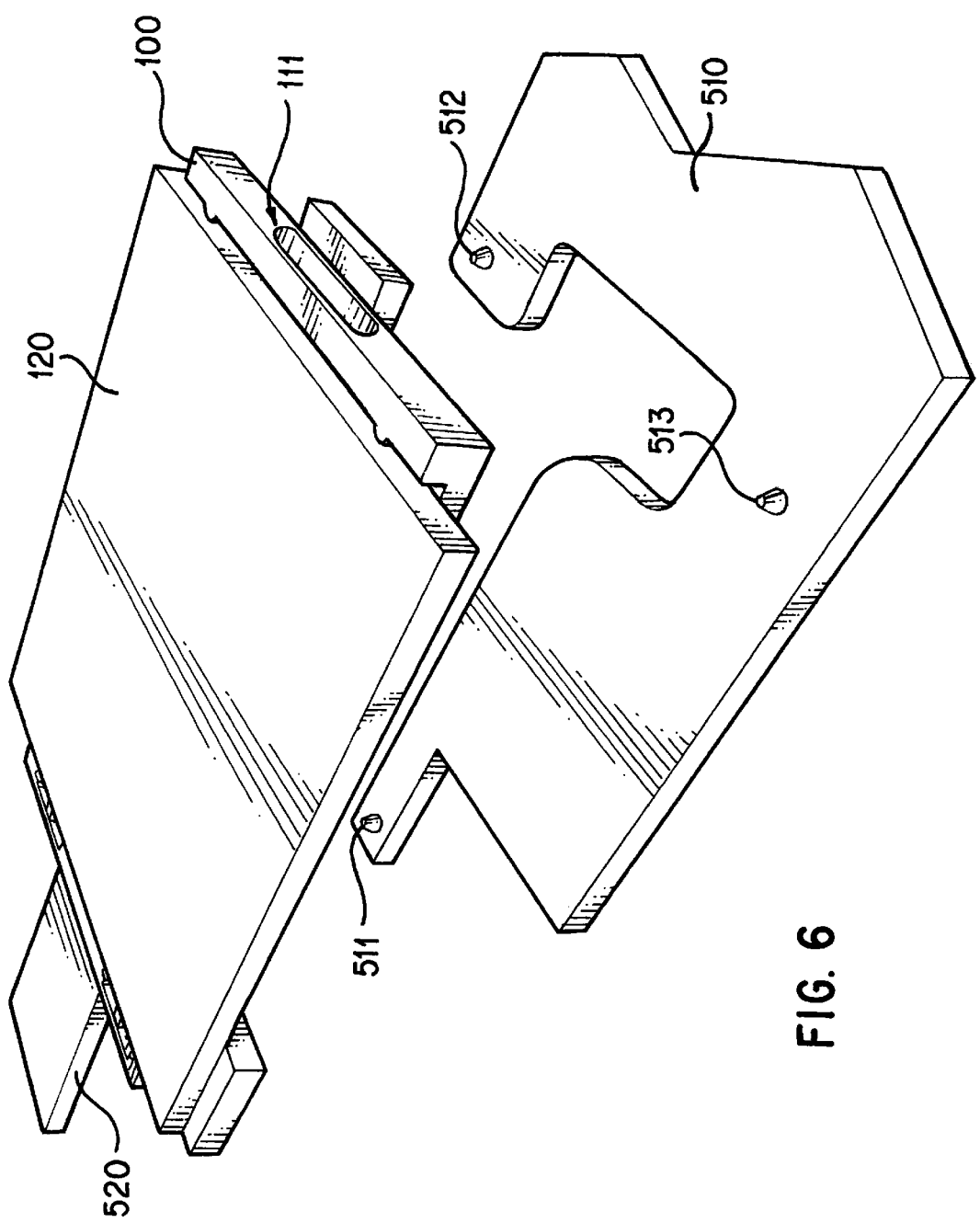
FIG. 6 illustrates a removable cover of the invention in position on a reticle being moved away from (or to) a shelf by an end effector.

FIG. 6 illustrates a perspective view of the structure of FIG. 5 from above, with the end effector 520 holding the reticle 120 and removable cover 100 above and away from the shelf 510. In this figure, positional locators 511–513 are visible on the shelf. While the positional locators are shown as bumps, detents or other positional locators may be used, so long as they can engage with the corresponding positional locators used on the removable cover.

Figure 7:
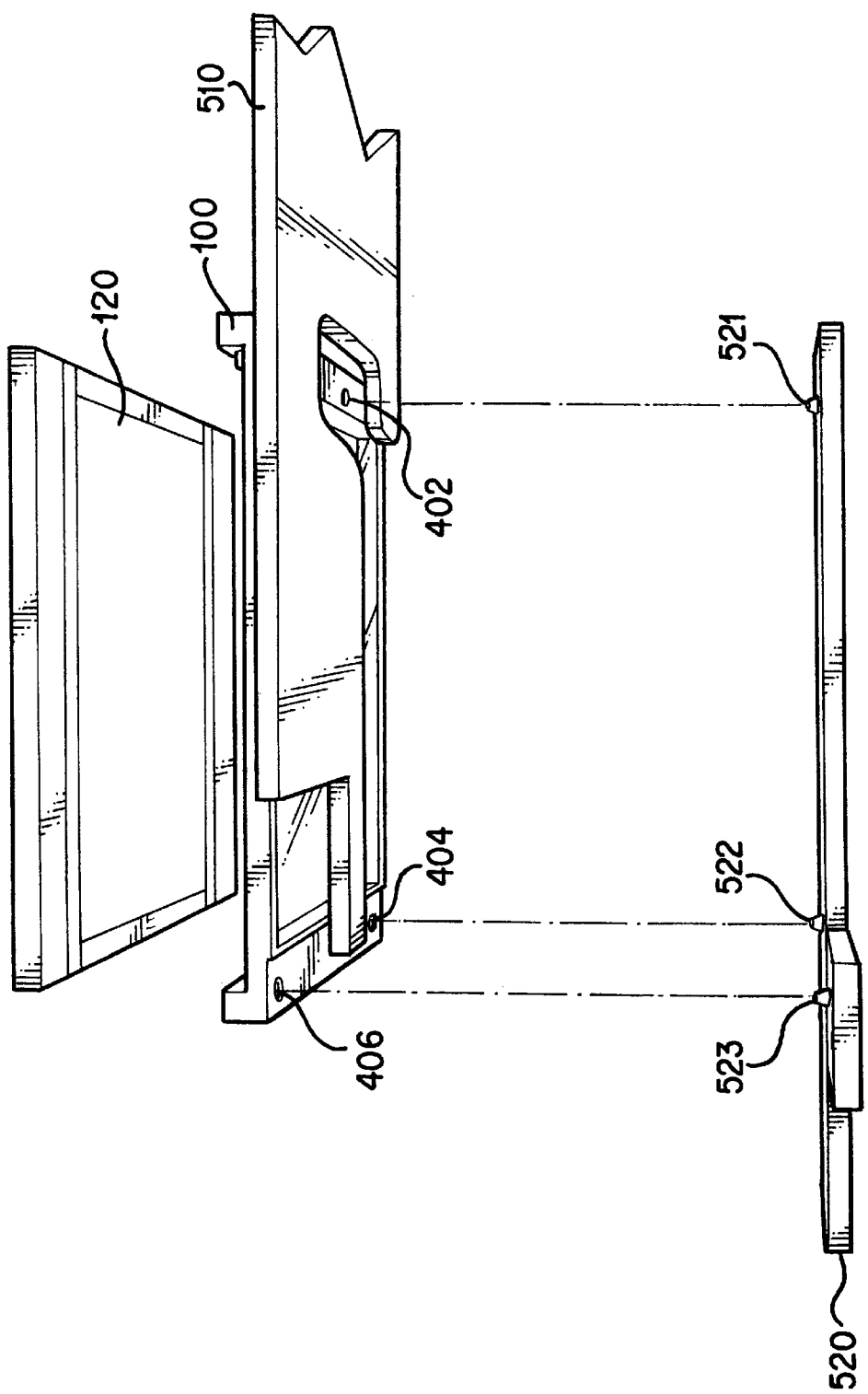
FIG. 7 is a bottom view illustrating the relationship between the removable cover of the invention together with a reticle, a shelf, and an end effector according to the invention.

FIG. 7 illustrates the removable cover 100 located on a shelf 510 with end effector 520 below the shelf. In FIG. 7, reticle 120 is depicted above the removable cover for illustration purposes. In this figure, positional locators 521–523 are visible on the end effector 520. While the positional locators are shown as bumps, detents or other positional locators may be used, so long as they can engage with the corresponding positional locators used on the removable cover.

Figure 8:
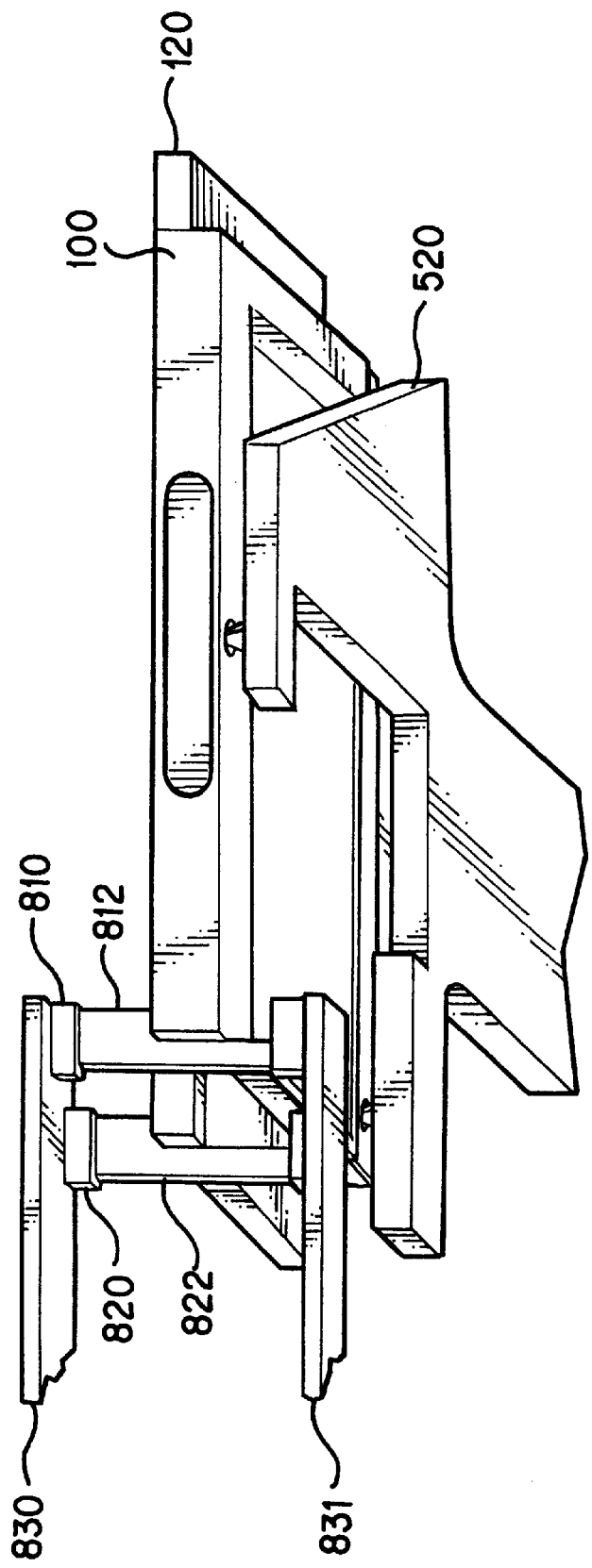
FIG. 8 illustrates an optical transmission sensor together with an end effector, removable cover, and reticle according to the invention.

FIG. 8 illustrates the use of two optical transmission sensors 810, 820. Optical transmission sensors 810, 820 are attached to supports 830, 831. 812 and 822 illustrated emission of light used with the sensors 810, 820. As the removable cover 100 and reticle 120 partially occlude the light 812, 822, the optical sensors 810, 820 are able to determine the location of the removable cover 100 and reticle 120. These sensors are used at stations where the removable cover is removed and attached to the reticle. The optical sensors ensure that the removable cover is centered on the reticle. The specific optical sensors used are of the type known to those skilled in the art. Alternatively, other types of sensors could be used to gather position information. The selection of different types of sensors would be apparent to a person skilled in the relevant art given this disclosure. For example, capacitance probes could be used in place of optical sensors 810 and 820. Furthermore, while two sensors have been depicted in FIG. 8, the actual number of sensors used could be different as would be apparent to a person skilled in the relevant art given this disclosure. Likewise, the location and orientation of the sensors can be changed without departing from the scope of the invention. Various locations and orientations would thus be apparent to a person skilled in the relevant art given this disclosure.

Figure 9:
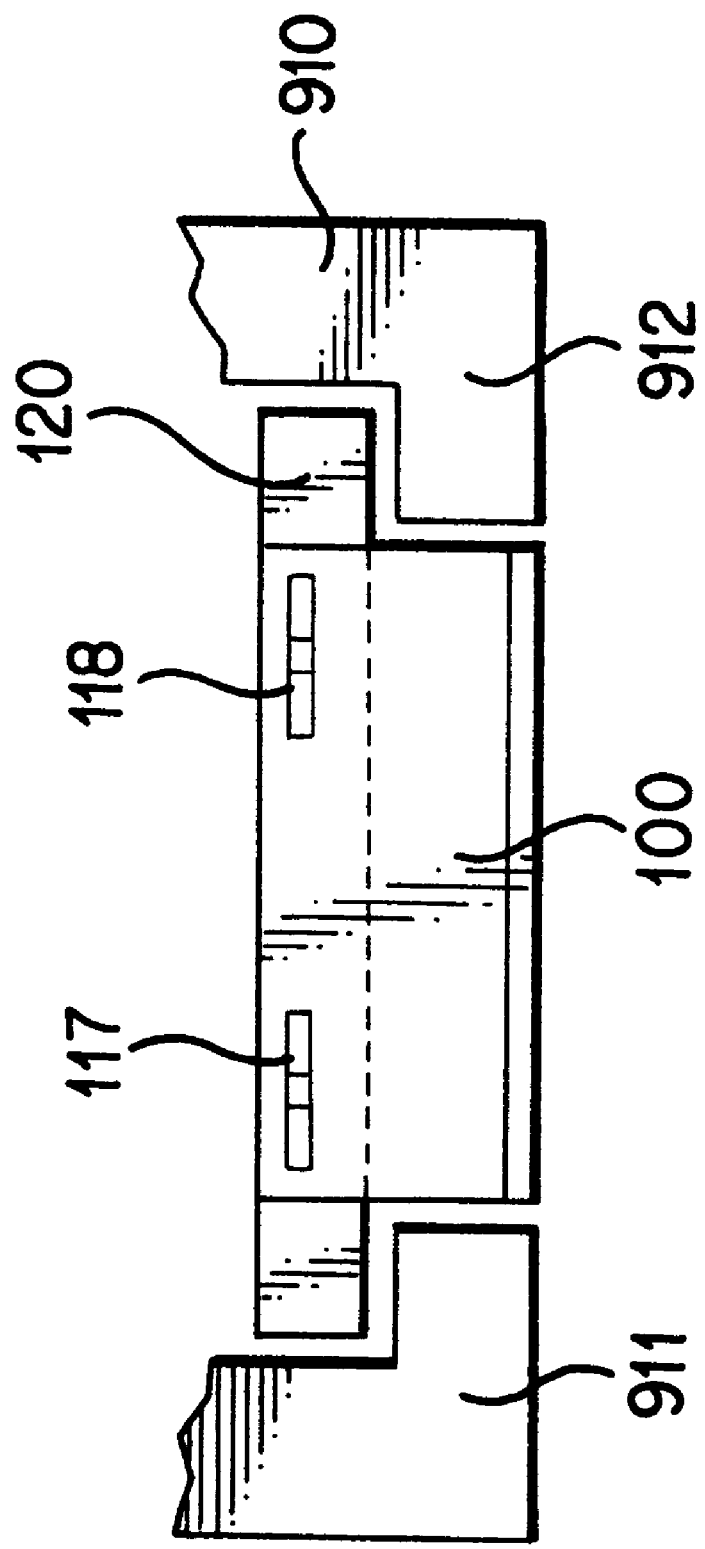
FIG. 9 is an end view of a mount together with a removable cover and reticle according to the invention.

FIG. 9 illustrates a removable cover 100 in place on a reticle 120, as the reticle is loaded into a mount 910. For simplicity, only a portion of the mount is depicted in the figure. As discussed above, the dimensions of the removable cover and reticle are selected such that the reticle can be mounted onto the mount with the cover in place. While one such arrangement that allows mounting with the cover in place has been shown, other arrangements and dimensions would be apparent to a person skilled in the relevant art given this disclosure. An end effector (not shown) is used to insert the removable cover into the mount. This insertion is done in a direction looking into the figure. Since the width of the removable cover is narrower than the mount, the removable cover is able to pass between opposing parts 911, 912 of the mount. Once in place on the mount, the reticle is secured by an element not shown in the figure. At this point, fasteners 117, 118 can be unfastened, and the removable cover can be moved clear of the reticle. Alternatively, fasteners 117, 118 can be unfastened at a fastening/unfastening station (not shown) located nearby, but separate from, the mount. Once the fasteners 117, 118 have been unfastened at the fastening/unfastening station, the reticle can be moved to the mount with the cover still held in place by gravity. After the reticle is mounted, the already unfastened cover can be removed. Once the removable cover is removed, lithographic exposure can take place.

During an EUV process, the patterned side of the reticle is facing down as shown in FIG. 9. During exposure, the EUV is directed up at the reticle. An image corresponding to the reticle pattern is then reflected back onto a substrate. Once the exposure process is complete, the removable cover can be replaced. This process is described below in connection with FIG. 10.

Figure 10A:
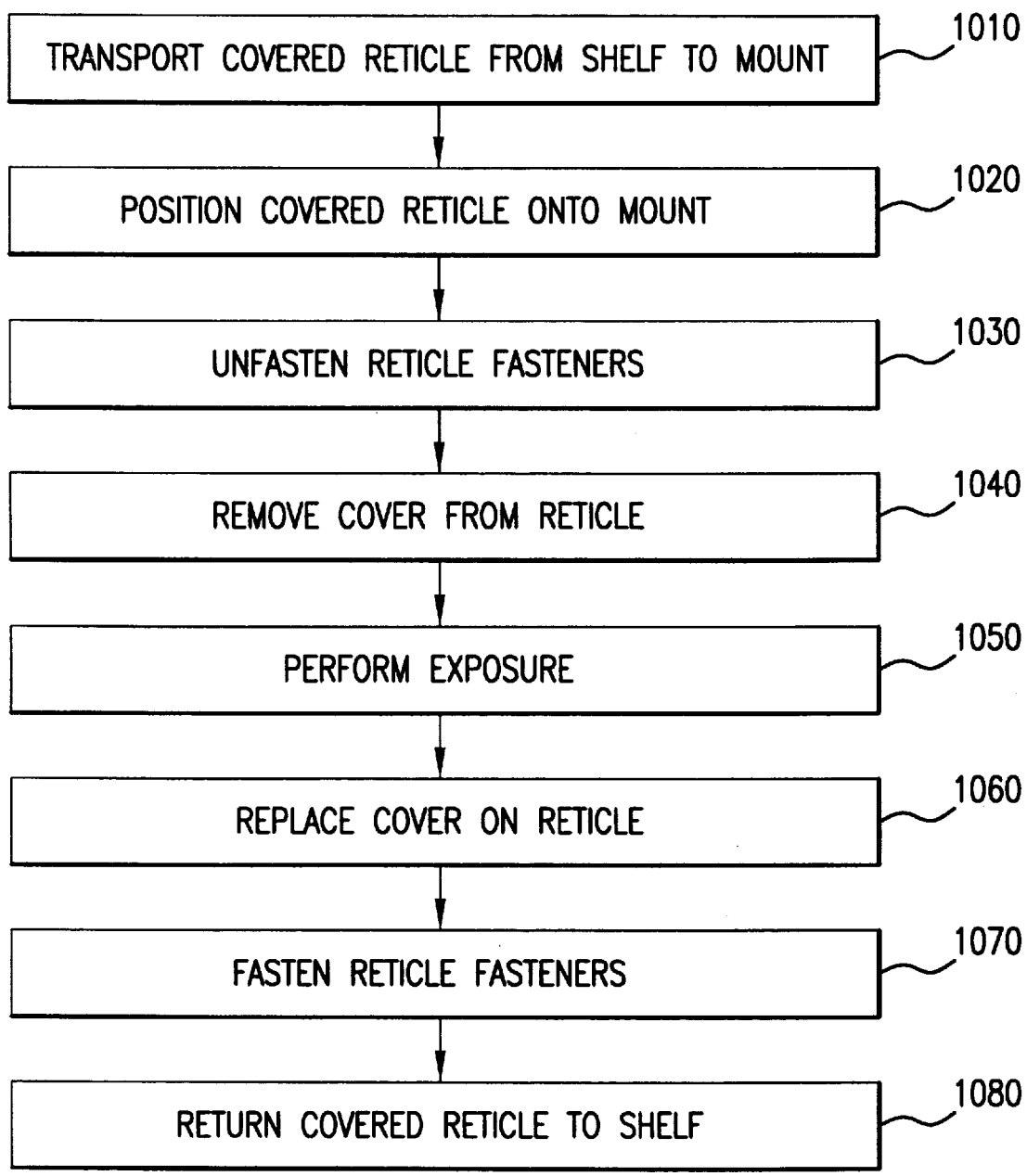
FIG. 10A is a process flow diagram of a first method according to the invention.

FIG. 10A is a process flow diagram illustrating steps in a first method according to the instant invention. In a first step 1010, a covered reticle is transported from a library shelf to a mount. In a next step 1020, the covered reticle is positioned onto the mount. Following step 1020, reticle fasteners located in the removable cover are unfastened in a step 1030. The cover is then moved away from the reticle in a step 1040. Once the reticle is uncovered, exposure can take place in a step 1050. Following exposure, the removable cover is replaced onto the reticle in a step 1060. Once the removable cover is in place, the reticle fasteners are fastened in a step 1070. Finally, the covered reticle is returned to the shelf in a final step 1080. In this manner, the removable cover is in place on the reticle during every step where the reticle is moved. This reduces opportunities for particles to settle on the reticle, thus increasing the time between necessary reticle cleaning.

Figure 10B:
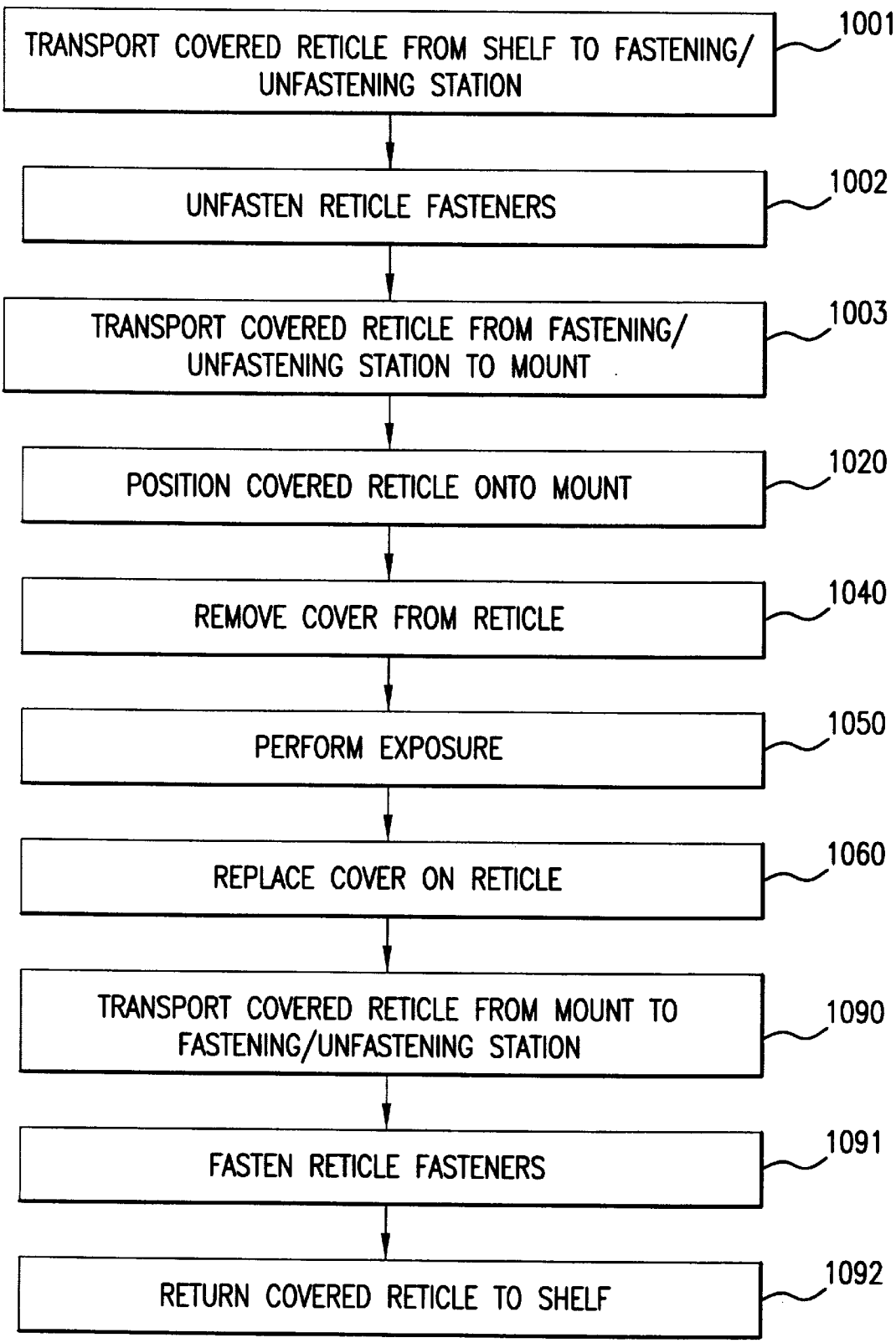
FIG. 10B is a process flow diagram of a second method according to the invention.

FIG. 10B is a process flow diagram illustrating steps in a second method according to the instant invention. In a first step 1001, a covered reticle is transported from a library shelf to a fastening/unfastening station. In a next step 1002, reticle fasteners located in the removable cover are unfastened while the covered reticle is located at the fastening/unfastening station. In a nest step 1003, the covered reticle is transported from the fastening/unfastening station to a mount. During step 1003, the cover is held in place by gravity. Since the fasteners are unfastened prior to step 1003, the transport speed of the covered reticle in this step should be slower than in transport steps where the fasteners are fastened. This slower speed minimizes the likelihood of movement of the cover relative to the reticle, as would be apparent to a person skilled in the relevant art given this disclosure. In a next step 1020, the covered reticle is positioned onto the mount. The cover is then moved away from the reticle in a step 1040. Once the reticle is uncovered, exposure can take place in a step 1050. Following exposure, the removable cover is replaced onto the reticle in a step 1060. In a next step 1090, the covered reticle is transported back to the fastening/unfastening station. As discussed above in connection with step 1003, the speed of transport during step 1090 is slower than it would be if the fasteners were fastened. Once the covered reticle is transported to the fastening/unfastening station, the reticle fasteners are fastened in a step 1091. Finally, the covered reticle is returned to the library shelf in a final step 1092. In this manner, the removable cover is in place on the reticle during every step where the reticle is moved. This reduces opportunities for particles to settle on the reticle, thus increasing the time between necessary reticle cleaning. Furthermore, by performing the fastening and unfastening at a fastening/unfastening station near to, but separate from, the mount, structural crowding at the mount can be minimized.

Figure 11:
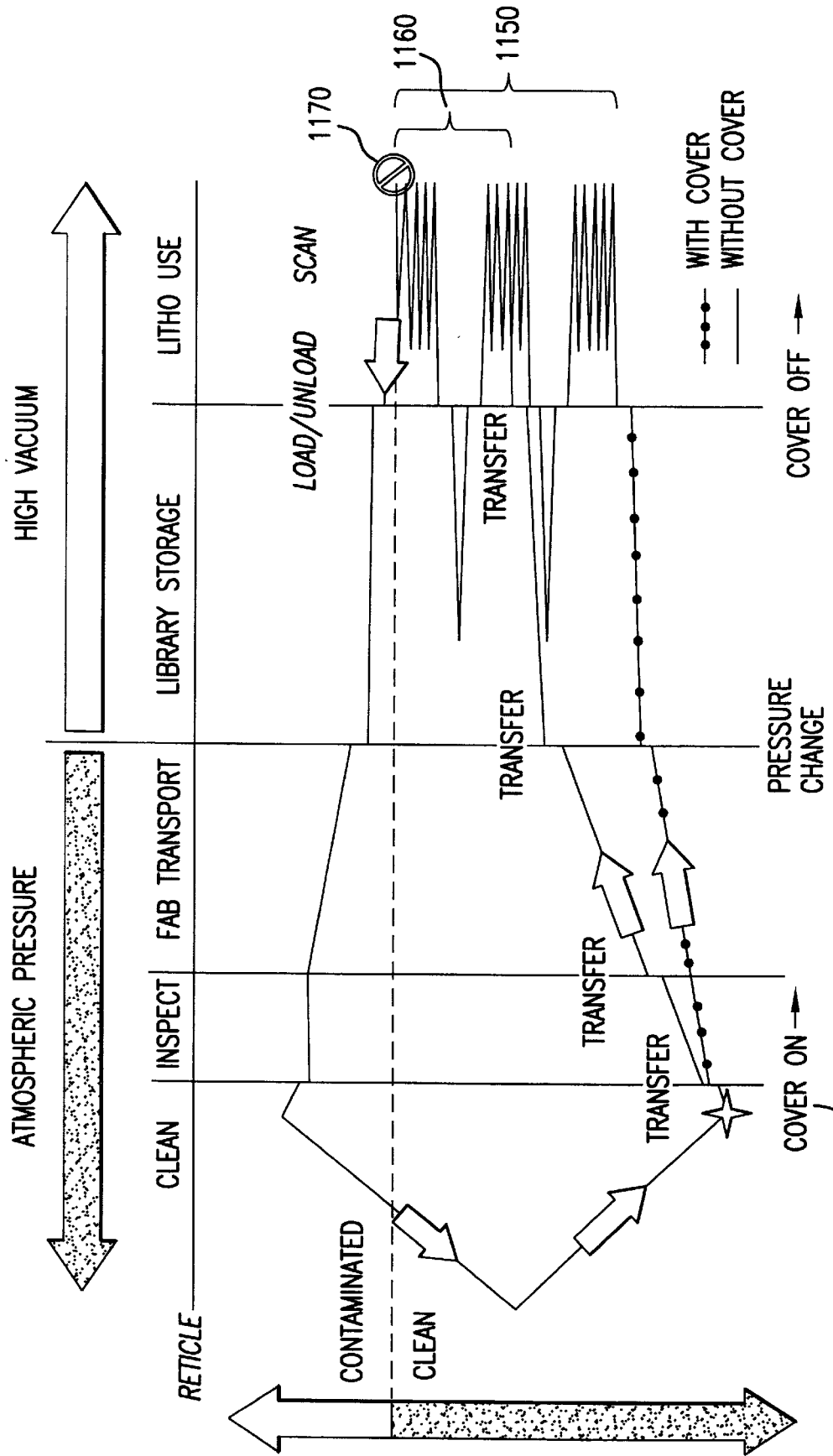
FIG. 11 is a graph depicting the contamination/cleaning cycle of reticles used within the high vacuum system of an EUV process.

FIG. 11 is a graph depicting the contamination/cleaning cycle of reticles used within the high vacuum system of an EUV process. FIG. 11 merely shows relative contamination levels and is thus not drawn to any particular scale. The cycle begins at point 1130, when the reticle is clean. As can be seen from the graph, inspection, transport, pressure change and storage are all opportunities for particles to contaminate the reticle. The lower line along the path from inspection to storage illustrates the level of contamination of the a covered reticle, while the upper line along the same path illustrates the level of contamination for an uncovered reticle. Reticle contamination is significantly reduced when the removable cover is in place. The removable cover of the instant invention can remain in place during inspection since it is transparent to an inspection wavelength. Likewise, the removable cover of the instant invention can remain in place during transport and storage since it is designed to be easily handled by a simple end effector. Furthermore, the removable cover of the instant invention can remain in place even while the reticle is mounted since it is designed to be compatible with the reticle mount. At the point where the cover is removed, during lithography use, the rate of contamination is the same in either case. However, the length of time where contamination is at an acceptable level is significantly less for the previously uncovered reticle 1160 than it is for the previously covered reticle 1150. Once contamination reaches an unacceptable level 1170 the reticle can no longer be used, and is ultimately returned for cleaning. Through the use of the removable cover of the invention, the instant inventors have discovered that the length of time that reticle may be used can be greatly improved over structures which lack a removable cover. This discovery is significant to EUV techniques where the use of a pellicle is not feasible.

Conclusion

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A removable cover to protect a reticle in a lithography system, comprising:
   a frame; and
   a membrane supported by said frame,
   wherein said removable cover protects the reticle during movement of the reticle between a shelf and a mount and is removable for lithographic exposure.

2. The removable cover of claim 1, further comprising at least one reticle fastener that applies force to the reticle thereby preventing movement of the removable cover relative to the reticle when the removable cover is in place.

3. The removable cover of claim 2, wherein said at least one reticle fastener comprises a bi-stable fastener.

4. The removable cover of claim 3, wherein said at least one reticle fastener comprises a plurality of bi-stable fasteners that serve to bias the reticle in a direction away from said bi-stable fasteners when said bi-stable fasteners are in a fastened position, said bi-stable fasteners adapted to be rotationally actuated.

5. The removable cover of claim 1, wherein said frame further comprises a filter that allows gas flow between the removable cover and the reticle when the removable cover is in place.

6. The removable cover of claim 1, where said frame further comprises a plurality of ridges, said ridges contacting the reticle when the removable cover is in place.

7. The removable cover of claim 6, further comprising at least one bi-stable fastener, said at least one bi-stable fastener biasing the reticle towards at least two of said plurality of ridges when the removable cover is in place and said at least one bi-stable fastener is in a fastened position.

8. The removable cover of claim 1, further comprising positional locators disposed on a side of the removable cover opposite from a side that faces the reticle when the removable cover is in place.

9. The removable cover of claim 8, wherein said positional locators are selected from the group consisting of bumps and detents.

10. The removable cover of claim 8, wherein said positional locators are arranged to permit contact between a first set of said positional locators and a shelf and between a second set of said positional locators and an end effector while said removable cover is disposed on said shelf.

11. The removable cover of claim 1, wherein said membrane is at least partially opaque to an exposure wavelength used in the lithography system.

12. A removable cover used to protect a reticle in a lithography system comprising:
    a frame with a plurality of sides surrounding an opening; and
    a plurality of flanges extending in a direction perpendicular to a plane corresponding to said opening such that when the removable cover is in place, the reticle is partially bounded at lateral edges by said plurality of flanges,
    wherein said removable cover protects the reticle during movement of the reticle between a shelf and a mount and is removable for lithographic exposure.

13. The removable cover of claim 12, wherein said plurality of flanges are integrally formed with said frame.

14. The removable cover of claim 12, further comprising a membrane covering said opening, said membrane being transparent to an inspection wavelength.

15. The removable cover of claim 14, further comprising at least one bi-stable fastener located within a first of said plurality of flanges.

16. The removable cover of claim 15, further comprising:
    a first ridge disposed on said frame adjacent said first flange; and
    second and third ridges disposed on said frame adjacent a second of said plurality of flanges opposite said first flange, said second and third ridges extending onto an interior side of said second flange such that when the removable cover is in place and said bi-stable fastener is in a fastened position, the reticle is biased towards said second and third ridges on said interior side of said second flange.

17. The removable cover of claim 16, further comprising positional locators disposed on a side of the removable cover opposite from a side that faces the reticle when the removable cover is in place.

18. The removable cover of claim 17, wherein said positional locators are selected from the group consisting of bumps and detents.

19. The removable cover of claim 17, wherein said positional locators are arranged to permit contact between a first set of said positional locators and a shelf and between a second set of said positional locators and an end effector while said removable cover is disposed on said shelf.

20. The removable cover of claim 14, wherein said membrane is at least partially opaque to an exposure wavelength used in the lithography process.

21. A lithographic system comprising:
    a reticle;
    a removable cover that protects said reticle when said reticle is not in use;
    a shelf that supports said reticle and said removable cover;
    a mount; and
    an end effector that transports said reticle with said removable cover in place from said shelf to said mount.

22. The lithographic system of claim 21, wherein said removable cover is transparent to an inspection wavelength and at least partially opaque to an exposure wavelength used in the lithographic system.

23. The lithographic system of claim 21, wherein said reticle extends beyond sides of said removable cover when said removable cover is in place.

24. The lithographic system of claim 23, further comprising removable cover positional locators disposed on a side of the removable cover opposite from a side that faces the reticle when the removable cover is in place.

25. The removable cover of claim 24, wherein said removable cover positional locators are selected from the group consisting of bumps and detents.

26. The lithographic system of claim 24, further comprising end effector positional locators disposed on said end effector such that said end effector positional locators engage with a first set of said removable cover positional locators when said end effector is in contact with said removable cover.

27. The lithographic system of claim 26, further comprising shelf positional locators disposed on said shelf such that said shelf positional locators engage with a second set of said removable cover positional locators when said removable cover is on said shelf.

28. The lithographic system of claim 27, wherein said first and second sets of said positional locators disposed on said removable cover are arranged to permit contact between said end effector and said removable cover while said removable cover is located on said shelf.

29. The lithographic system of claim 21, further comprising a fastening/unfastening station located adjacent to said mount, wherein fasteners located within said removable cover are fastened and unfastened at said fastening/unfastening station.

30. A method of performing lithography comprising the steps of:

(a) positioning a reticle covered by a removable cover onto a mount;

(b) removing said removable cover from said reticle;

(c) performing lithographic exposure; and (d) replacing said removable cover on said reticle.

31. The method of claim 30, further comprising a step of transporting said reticle covered by said removable cover from a shelf to said mount prior to said step (a).

32. The method of claim 31, further comprising a step of returning said reticle covered by said removable cover to said shelf after said step (d).

33. The method of claim 30, further comprising a step of inspecting said reticle while said removable cover is in place.

34. The method of claim 30, wherein said step (b) includes a step of unfastening at least one bi-stable fastener on said removable cover thereby releasing said reticle from said removable cover.

35. The method of claim 34, wherein said step (d) includes a step of fastening said at least one bi-stable fastener on said removable cover thereby securing said reticle to said removable cover.

36. The method of claim 30, further comprising a step of unfastening fasteners located in said removable cover at a fastening/unfastening station prior to said step (a).

37. The method of claim 30, further comprising a step of fastening fasteners located in said removable cover at a fastening/unfastening station after said step (d).

38. The removable cover of claim 1, wherein said membrane is transparent to an inspection wavelength such that reticle can be inspected with said removable cover in place.

* * * * *

UNITED STATES PATENT AND TRADEMARK OFFICE
CERTIFICATE OF CORRECTION

PATENT NO. : 6,239,863 B1  Page 1 of 1
DATED : May 29, 2001
INVENTOR(S) : Catey et al.

It is certified that error appears in the above-identified patent and that said Letters Patent is hereby corrected as shown below:

Title page,
Please insert the following:
-- Related U.S. Application Data
Item [60] Provisional Application No. 60/158,142, filed on Oct. 8, 1999. --

Signed and Sealed this

Nineteenth Day of February, 2002

Attest:

JAMES E. ROGAN
Attesting Officer  Director of the United States Patent and Trademark Office